United States Patent [19]

Lupi et al.

[11] Patent Number: 5,175,452

[45] Date of Patent: Dec. 29, 1992

[54] PROGRAMMABLE COMPENSATED DIGITAL DELAY CIRCUIT

[75] Inventors: Annibale M. Lupi; Massimo G. Lupi, both of Clifton, N.J.

[73] Assignee: Data Delay Devices, Inc., Clifton, N.J.

[21] Appl. No.: 767,416

[22] Filed: Sep. 30, 1991

[51] Int. Cl.⁵ .................. H03K 5/159; H03K 3/01
[52] U.S. Cl. ............................ 307/591; 307/595; 307/597; 307/602; 307/603; 307/605; 307/606; 328/55; 328/66
[58] Field of Search ............. 307/591, 595, 597, 602, 307/603, 605, 606; 328/55, 66

[56] References Cited

U.S. PATENT DOCUMENTS

| | | | |
|---|---|---|---|
| 3,558,924 | 1/1971 | Lindell | 307/260 |
| 4,016,511 | 4/1977 | Ramsey et al. | 307/603 |
| 4,443,765 | 4/1984 | Findeisen et al. | 328/55 |
| 4,458,165 | 7/1984 | Jackson | 307/603 |
| 4,482,826 | 11/1984 | Ems et al. | 307/602 |
| 4,504,749 | 3/1985 | Yoshida | 307/603 |
| 4,530,107 | 7/1985 | Williams | 307/602 |
| 4,618,788 | 10/1986 | Backes et al. | 307/594 |
| 4,626,716 | 12/1986 | Miki | 307/602 |
| 4,745,310 | 5/1988 | Swapp | 307/597 |
| 4,797,586 | 1/1989 | Traa | 307/608 |
| 4,843,265 | 6/1989 | Jiang | 307/591 |
| 4,845,390 | 7/1989 | Chan | 307/595 |
| 4,866,314 | 9/1989 | Traa | 307/603 |
| 4,878,028 | 10/1989 | Wang et al. | 307/595 |
| 5,028,824 | 7/1991 | Young | 307/263 |
| 5,081,380 | 1/1992 | Chen | 307/597 |
| 5,087,842 | 2/1992 | Pulsipher et al. | 307/597 |

Primary Examiner—Andrew J. James
Assistant Examiner—Trong Phan
Attorney, Agent, or Firm—Siegmar Silber, Esq.

[57] ABSTRACT

The disclosed device is a programmable compensated digital delay circuit which has a design format suited for integrated circuitry utilizing complementary MOS technology. In the device, a signal-to-be-delayed is provided to the time delay cells which, are selectively interconnectable, for forming one or more delay configurations. In each delay cell, selectable capacitive elements are arrayed in a weighted manner and a memory programmably selects the capacitive elements by switching differently rated capacitive elements into and out of the circuit. Also, selectable current sources are arrayed in a weighted manner, and another memory programmably selects the current sources by switching differently rated current sources into and out of the circuit. The device further includes internal compensation, and, uses a ring oscillator for temperature and power supply compensation. The ring oscillator is formed from a plurality of time delay cells selected for interchangeability with the delay cells. Each ring oscillator has selected capacitive elements and current sources identical to the corresponding delay line. The output of the delay is connected to the input of the ring oscillator and through an error voltage circuit produces an error-voltage signal to adjust a variable current to the time delay cells. A pulse-width distortion compensation device is provided to compensate the delay line for switching non-linearities. The pulse-width compensation portion of the device serially connects an even number of complementary delay elements so as to cancel transfer function deviations.

22 Claims, 5 Drawing Sheets

PROGRAMMABLE COMPENSATED DIGITAL DELAY CIRCUIT

BACKGROUND OF THE INVENTION

1. Field of the Invention

This invention relates to a delay circuit, and, more particularly, to one having a design format suited for integrated circuitry utilizing CMOS technology. The delay circuit is a novel programmable digital delay circuit that is compensated for temperature, power supply, and fabrication process variations.

2. Information Disclosure Statement

U.S. Pat. No. 4,016,511—J. L. Ramsey et al. (US Air Force)

Discloses a variable delay means comprising a plurality delay sections of progressively increasing delay time and logic means for selecting the same.

U.S. Pat. No. 3,558,924—E. Lindell (General Precision Systems, Inc.)

Discloses a system employing a ramp generator and a plurality of comparators to provide different time delayed outputs.

U.S. Pat. No. 4,443,765—A. G. Findeisen et al. (US Navy)

Discloses a programmable delay line having multiple taps employing shift registers.

U.S. Pat. No. 4,482,826—S. C. Ems et al. (LeCroy Research Systems Corp.)

Discloses a programmable delay circuit employing inverter elements.

U.S. Pat. No. 4,530,107—M. Williams (Ampex Corp.)

Discloses an externally controlled delay circuit having shift registry providing fine and coarse delays.

U.S. Pat. No. 4,458,165—R. M. Jackson (Tektronix Inc.)

Discloses a programmable delay cell incorporating a delay device per se and input and output multiplexers.

U.S. Pat. No. 4,618,788—R. Backes et al. (ITT Industries, Inc.)

Discloses delay means comprising a chain of inverter pairs, the delay of each being adjustable by the same control voltage.

U.S. Pat. No. 4,626,716—Y. Miki (Sony/Tektronix Corp.)

Discloses selecting a delayed or non-delayed output from each of a chain of delay devices.

U.S. Pat. No. 4,745,310—M. C. Swapp (Motorola Inc.)

Discloses a programmable delay circuit employing a counter and comparator.

U.S. Pat. No. 4,797,586—E. O. Traa (Tektronix, Inc.)

Discloses driving a plurality of transconductance amplifiers from the inputs of a chain of buffers, varying the gains of the former and summing their outputs to get a variable delay.

U.S. Pat. No. 4,843,265—C. L. Jiang (Dallas Semiconductor Corp.)

Discloses a digital delay circuit comprising a reference clock and a plurality of arrays of delay devices controlled by a voltage derived from a comparator.

U.S. Pat. No. 4,866,314—E. O. Traa (Tektronix, Inc.)

Discloses a delay cell for a programmable delay unit where long or short delay paths may be selected.

U.S. Pat. No. 5,028,824—W. R. Young (Harris Corp.)

Discloses a programmable delay where an input pulse and control pulse are logically combined, processed and recombined with the original input.

No one patent uncovered shows the delay circuit hereof or teaches toward the replacement of hybrid active delay lines and related timing circuits. The technology described hereinbelow requires no reference frequency and is self-compensating for temperature and power supply variations.

SUMMARY OF THE INVENTION

The invention disclosed hereby is a programmable compensated digital delay circuit. The design format thereof is suited for integrated circuitry utilizing complementary MOS technology. In the integrated circuit delay, a precise single element is provided that spans a wide delay range. The element has multiple time delay cells that are selectively interconnectable to form one or more delay lines. Each time delay cell has controllable capacitive elements and current sources which, in turn, are selected by use of a nonvolatile memory.

In the preferred embodiment hereinbelow, both the capacitive elements and the current sources are arrayed in a weighted manner and, more particularly, in a binary weighted manner. The delay is set by using portions of the nonvolatile memory to select capacitive elements and current sources. With the nonvolatile memory portions functioning cooperatively with other integrated circuitry, differently rated capacitive elements and current sources are switched into and out of the circuit.

The programmable compensated digital delay circuit of the invention is self-compensating for temperature and power supply variations. The compensation adjusts the operating levels and subranges of the time delay lines.

With the device disclosed, a precision delay line is formed from complementary MOS technology without using a reference frequency. The precision delay line is further characterized by high pulse fidelity that is, one with substantially no pulse width distortion and by high operating frequency.

It is an object of the present invention to provide a programmable delay circuit of an improved design.

It is a further object of the present invention to provide a precision delay element in an integrated circuit form which utilizes CMOS technology.

It is yet another object of the present invention to provide a delay circuit with a wide delay range and precise control of the leading and trailing edges.

It is still yet another object of the present invention to provide a programmable delay circuit in which weighted capacitor values can be aggregated to establish an operating subrange for the delay circuit.

It is a feature of the present invention that the timing reference is developed internally by a ring oscillator subcircuit.

It is another feature of the present invention to have a confluence of weighted capacitors and weighted current sources which, when selected by the programmable memory, develop a specific time delay without a clock reference.

It is yet another feature of the present invention to minimize pulse width distortion by using redundant cells to cancel switching nonlinearities.

Other objects and features of the invention will become apparent upon review of the drawings and the detailed description which follow.

BRIEF DESCRIPTION OF THE DRAWINGS

In the following drawings, the same parts in the various views are afforded the same reference designators.

DESCRIPTION OF THE PREFERRED EMBODIMENT

By way of introduction and in general terms, a delay line output replicates the signal present at its input shifted in time. Of the two basic types of delay lines—analog and digital—the digital delay line preserves the input signal pulse width and frequency. The disclosure at hand provides a CMOS integrated circuit which provides for the delay being set by a programmable, nonvolatile memory and which replaces hybrid active delay lines and related timing circuits. The circuitry takes advantage of the complementary architecture by using, in the preferred embodiment, complementary inverter-type circuitry to reduce pulse width distortion and to thereby provide high pulse fidelity. As also will be seen by the description which follows, the integrated circuit is self-compensating for temperature and power supply variations and provides a delay line capable of high operating frequencies without requiring a reference frequency.

In order for the circuit to have a time delay which is independent of temperature and power supply variations, the inverter-type circuitry must be independent of such variations. This implies that, for the CMOS technology described herein, both the selected capacitive elements and the selected current sources must also be independent of temperature and of power supply variations. However, it is well known that the current through such circuitry is temperature and power supply dependent. In the present invention, compensation for the temperature and power supply variations is achieved by feedback circuitry incorporating a ring oscillator. This provides appropriate changes in the control voltage applied to the delay line.

Figure 1:
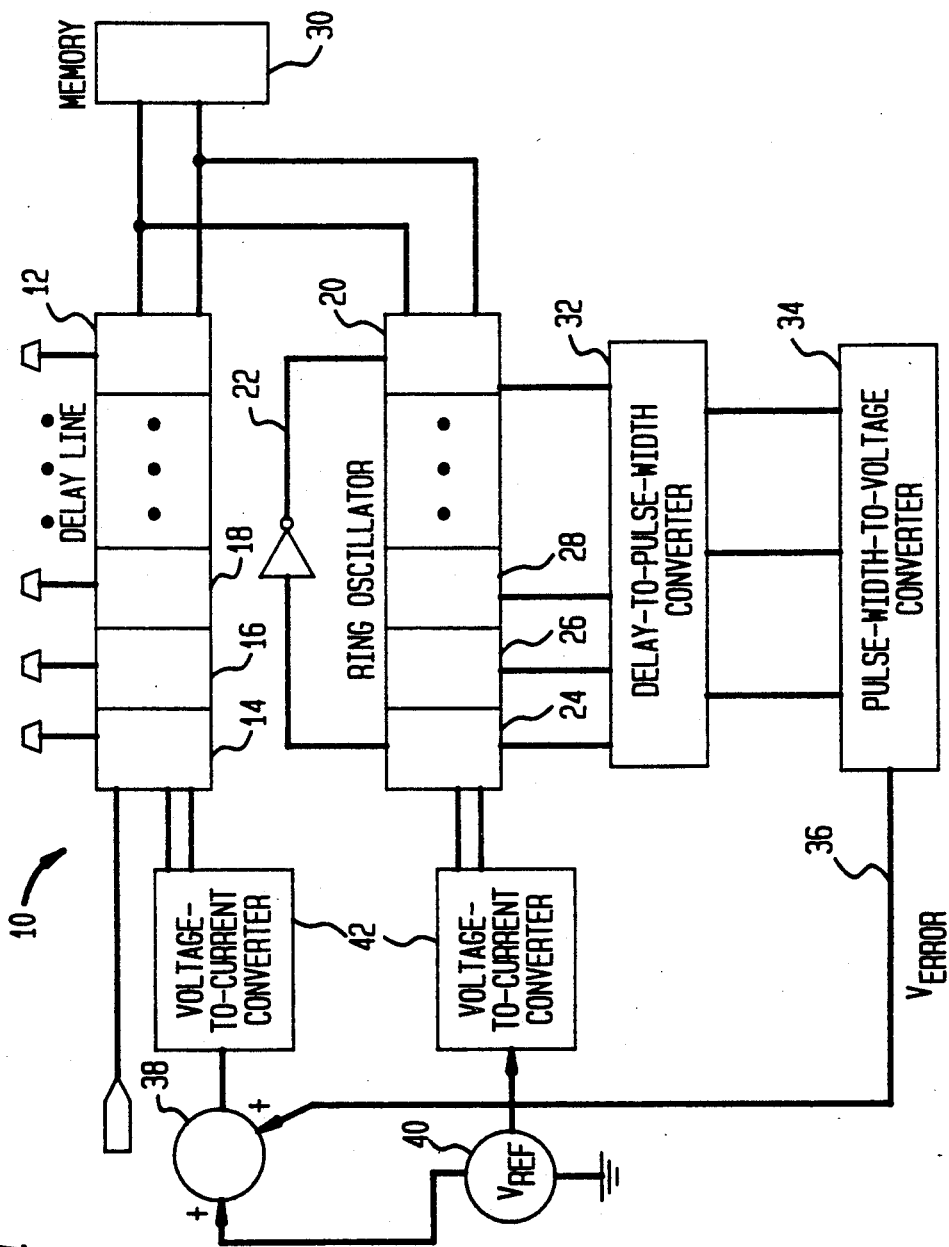
FIG. 1 is a block diagram of the programmable compensated delay circuit of the present invention.

The schematic diagram FIG. 1 shows the programmable compensated digital delay circuit of this invention, which is referred to generally by the reference designator 10. The major blocks in the circuit include a delay line 12 which, in turn, is composed of a plurality of delay cells 14, 16, and 18. A second and duplicate set of the delay cells are configured into a ring oscillator 20 which includes feedback loop 22. The oscillator cells 24, 26, and 28 correspond to the delay line cells 14, 16, and 18, respectively. While, for purposes of this example, only three cells are shown in both the delay line and the ring oscillator the number which may be constructed is only limited by the device architecture. Both the delay line 12 and the ring oscillator 20 are served by a nonvolatile memory 30, such as an E-PROM (Erasable Programmable Read Only Memory). The outputs from the ring oscillator are provided to a converter 32 which, in turn, converts the time delay thereof into pulse widths. Upon conversion to pulse-width information, the data from the converter 32 is provided to a pulse-width-to-voltage controller 34 which produces a voltage error signal 36. The error signal is combined at summer 38 with the reference voltage 40 and generates therefrom a voltage which, in turn, is impressed on the delay line 12 through a voltage-to-current converter 42. The reference voltage is impressed upon the ring oscillator 20 through a second voltage-to-current converter 42.

Figure 2:
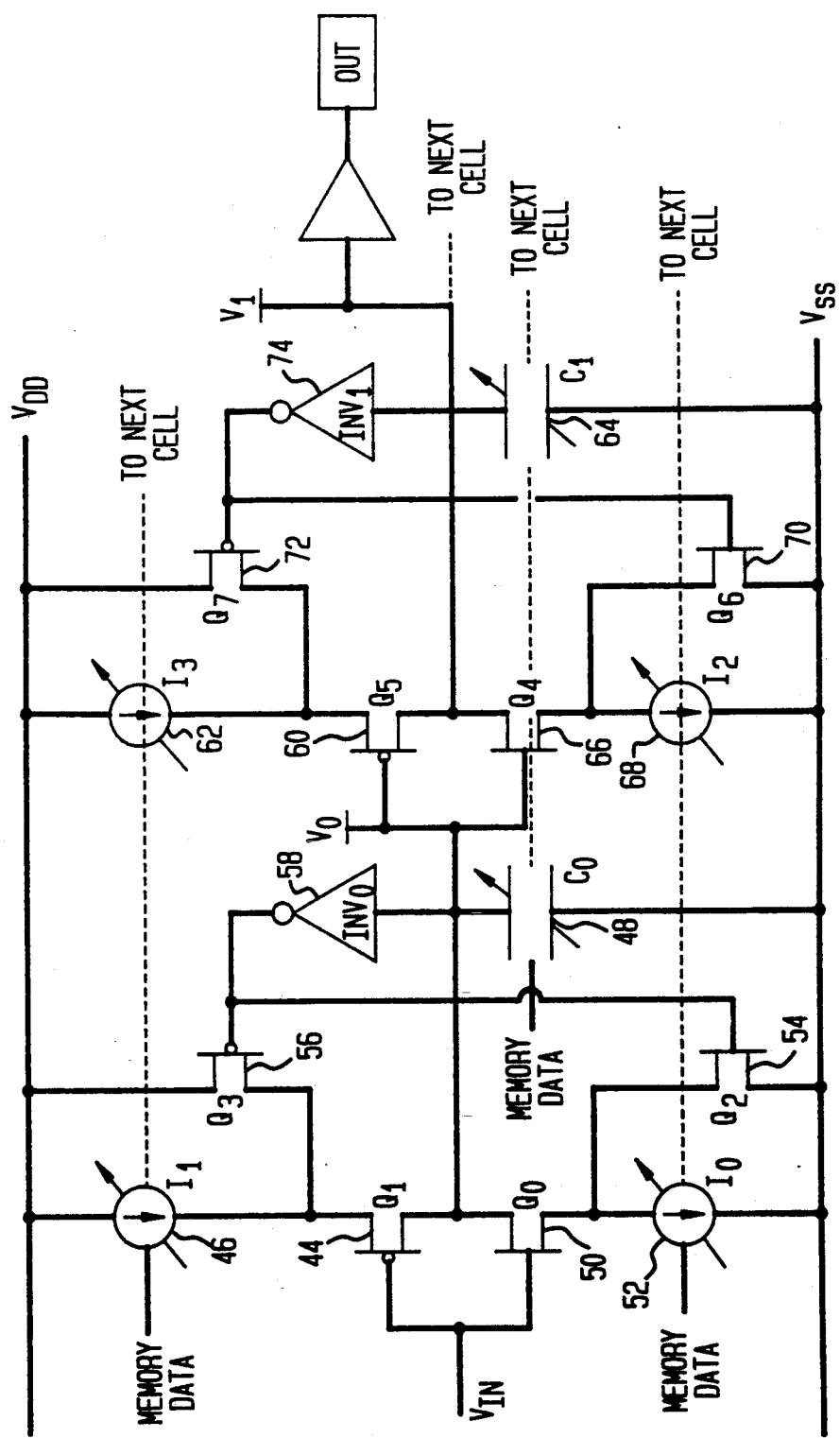
FIG. 2 is a schematic diagram of an exemplary delay cell of the delay line portion shown in FIG. 1.

Turning now to FIG. 2, the basic delay cell is illustrated in schematic form and is shown as comprising two identical, but complementary, current-source- and capacitance-controlled delay inverters. The programmable voltage controlled current sources and capacitor network generate the desired delay as per the following equation:

$$It = CV$$

and where $V = V_{DD}/2$ is the CMOS threshold voltage, then:

$$t_{Delay} = CV_{DD}/2I$$

Transistor ($Q_1$) 44 connects current source ($I_1$) 46 to charge capacitor ($C_0$) 48 while transistor ($Q_0$) 50 connects current source ($I_0$) 52 to discharge capacitor ($C_0$) 48. Transistors ($Q_2$, $Q_3$) 54 and 56, respectively and inverter ($INV_0$) 58 provide positive feedback to modified inverter string. Likewise, transistor ($Q_5$) 60 connects current source ($I_2$) 62 to charge capacitor ($C_1$) 64 while transistor ($Q_4$) 66 connects current source ($I_2$) 68 to discharge capacitor ($C_1$) 64. Transistors ($Q_6$, $Q_7$) 70 and 72, respectively, and inverter ($INV_1$) 74 provide positive feedback to the modified inverter string. In the best mode of practicing this invention, capacitors 48 and 64 are constructed from a series of programmable capacitive elements, preferably weighted in a binary series format with each successive element in the series having twice the capacitance of the preceeding one. Also, in the best mode of practicing this invention, current sources 46, 52, 62 and 68 are constructed from a series of programmable current sources, preferably weighted in a binary series format with each successive element in the series having twice the current of the preceeding one. The use of complementary CMOS circuitry in this manner is explained in further detail hereinbelow, especially with respect to avoiding the effect of circuit nonlinearities on transfer function timing.

Figure 3A:
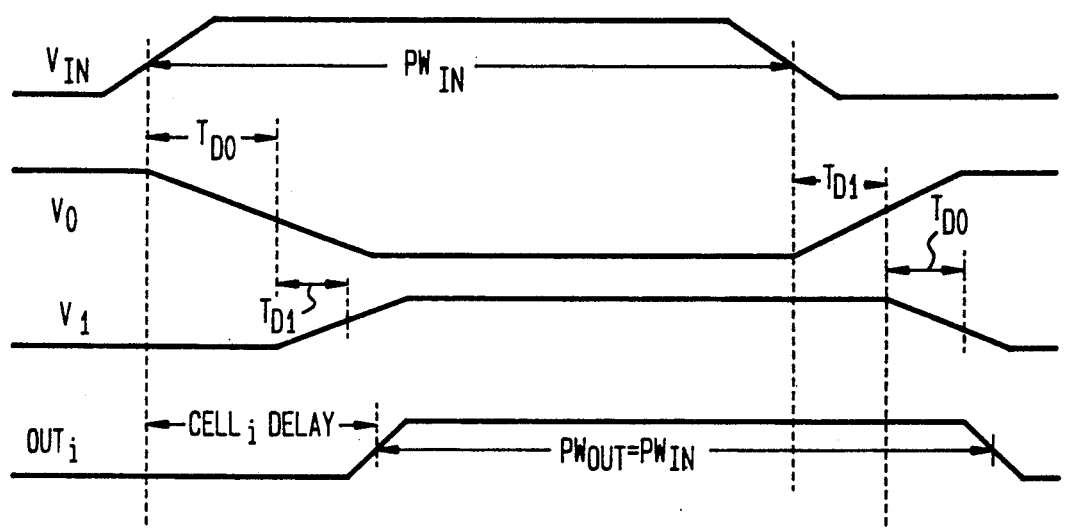
FIGS. 3a-b is a timing diagram of the delay cell of FIG. 2.
Figure 3B:
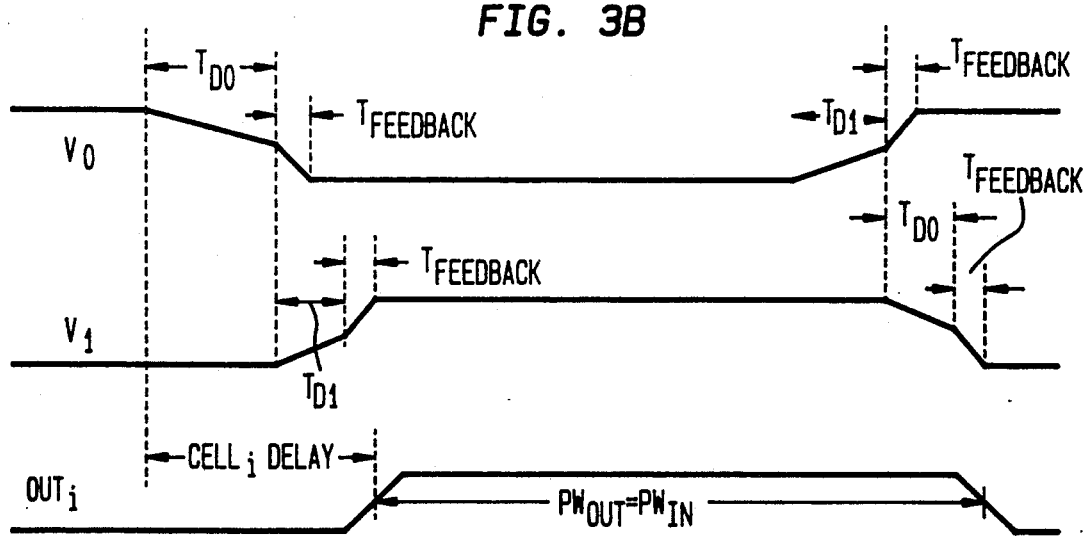

Turning now to FIG. 3, delay line pulse width distortion is next discussed. With the present state of CMOS technology, the charging transfer function time is not equal to the discharging transfer function time. This results from nonlinearities introduced by the capacitor switching transistors, ON resistance, and current source voltage compliance requirements. Therefore, the modified inverter string is described by a $G_{rise}$ transfer function processing the input rising edge and by a $G_{fall}$ transfer function processing the input falling edge. This results in a distorted output pulse, that is, the input pulse width does not equal the output pulse width. To correct this, two identical modified inverter strings are connected in series such that:

$$V_{1\ rise} = V_{in\ rise}\ G_{rise}\ G_{fall};\ \text{and,}$$

$$V_{1\ fall} = V_{in\ fall}\ G_{fall}\ G_{rise}$$

and therefore $V_{1\ rise} = V_{1\ fall}$ and the pulse width in preserved from input to output as illustrated in FIG. 3. The delay of the first inverter is given by:

$$T_{D0} = \left[ C_0 \left( 1 + \sum_{i=0}^{n-1} Q^{ibi} \right) V_{DD} \right] / \left[ Q \times I_0 \left( 1 + \sum_{j=0}^{m-1} Q^{jaj} \right) \right]$$

where: $b_i = 0$ or 1; and, $a_j = 0$ or 1.

The cell delay is given by:

$$T_{D1} = \left[ C_0 \left( 1 + \sum_{i=0}^{n-1} Q^{ibi} \right) V_{DD} \right] / \left[ I_0 \left( 1 + \sum_{j=0}^{m-1} Q^{jaj} \right) \right]$$

where $C_0$ is the capacitance with all $b_i = 0$ and $I_0$ is the current with all $a_j = 0$.

Positive feedback, provided by transistors $Q_2$ $Q_3$, $Q_6$, $Q_7$, and inverters $INV_0$ and $INV_1$ *increases* the cell noise immunity and enhances the operating frequency thereof.

FIG. 3 further illustrates the cell timing with the addition of positive feedback. While $V_{IN}$ is less than the switching threshold ($V_{DD}/2$). Transistors $Q_1$ and $Q_3$ are ON, $Q_1$ and $Q_2$ are OFF and the voltage across capacitor $C_0$ equals $V_{DD}$. When $V_{IN}$ is greater than or equal to the threshold voltage, transistors $Q_1$ and $Q_2$ are OFF, and transistors $Q_0$ and $Q_3$ are ON, then capacitor $C_0$ is discharged by $I_0$. When the capacitor $C_0$ voltage falls below the threshold voltage, transistor $Q_3$ turns off while transistor $Q_2$ turns ON, thereby quickly discharging to the $C_0$ capacitor. The inverse occurs when $V_{IN}$ switches from $V_{DD}$ to zero. Therefore, the minimum period (or maximum frequency) is given by:

$$PERIOD_{(MIN)} = 2 \times PW_{MIN}$$

$$PW_{MIN} = 2 \times (T_{0\ discharge} + T_{0\ feedback} + T_{1\ charge} + T_{1\ feedback})$$

A nonvolatile memory, organized as N by 1 bits, is used. The memory data selects the device operating mode, the delay range and the desired delay. The monitoring circuit measures the temperature and power supply variations of the semiconductor technology dependent parameter of interest and it generates an error signal. Such signal, appropriately scaled, is added in opposition to the delay circuit control signal to compensate for temperature and power supply induced delay errors. The monitoring circuit (implementation dependent) measures the parameter of interest variations which are power supply dependent and it generates an error signal. Such signal, appropriately scaled, is added in opposition to the delay circuit control signal to compensate for power supply induced delay errors.

Figure 4:
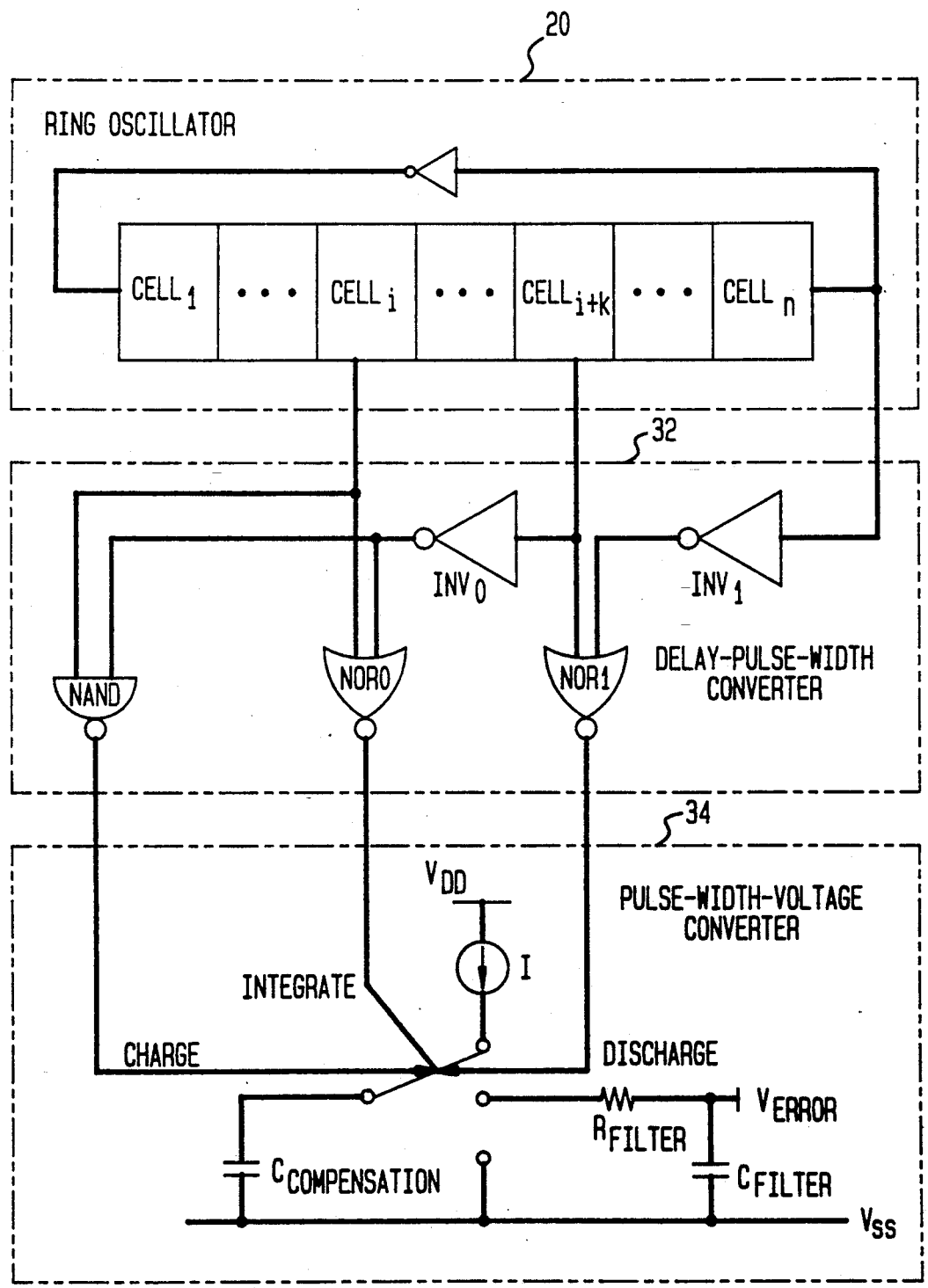
FIG. 4 is a schematic diagram of the ring oscillator and associated monitoring and compensation circuitry of invention shown in FIG. 1; and, FIG. 5 is a timing diagram of the circuitry shown in FIG. 4.

FIG. 4 illustrates schematically the details of the ring oscillator 20, FIG. 1; the delay-to-pulse width converter, 32; and, the pulse-width-to-voltage converter 34. Upon a temperature variation, a power supply variation, or combination thereof disturbing the predetermined delay of the ring oscillator cell, the NAND output pulse width and the capacitor C voltage simultaneously follow the delay variations. The ring oscillator is comprised of modules which, because of identical structure to those of the delay line cells, generate a signal having a period equal to twice the number of its constitutent cells times the cell set delay. The delay-to-pulse-width converter comprises logic elements $INV_0$, $INV_1$, NAND, $NOR_0$ and $NOR_1$. The NAND gate output which is normally high (5V) is asserted low (0 V) by cell$_i$ output transition from low to high. The NAND output remains low for the time (delay) that is required for cell$_i$ low-to-high output transition to appear at the cell $_{i+k}$ output. The low-to-high transition of the cell $_{i+k}$ causes the NAND output to switch back to its normal high state. The length of time (pulse width) that the NAND output is in the low (0 V) state is therefore linearly dependent on the predetermined cell delay. The NAND output connects current source I to compensation capacitor C, thus charging C for a time equal to the delay between cell $_i$ and cell $_{i+k}$. Thus a delay dependent voltage is developed according to:

$$I_t = CV;\ \text{where,}\ t = PW_{NAND},\ \text{and,}$$

$$V = V_{Compensating}.$$

Figure 5:
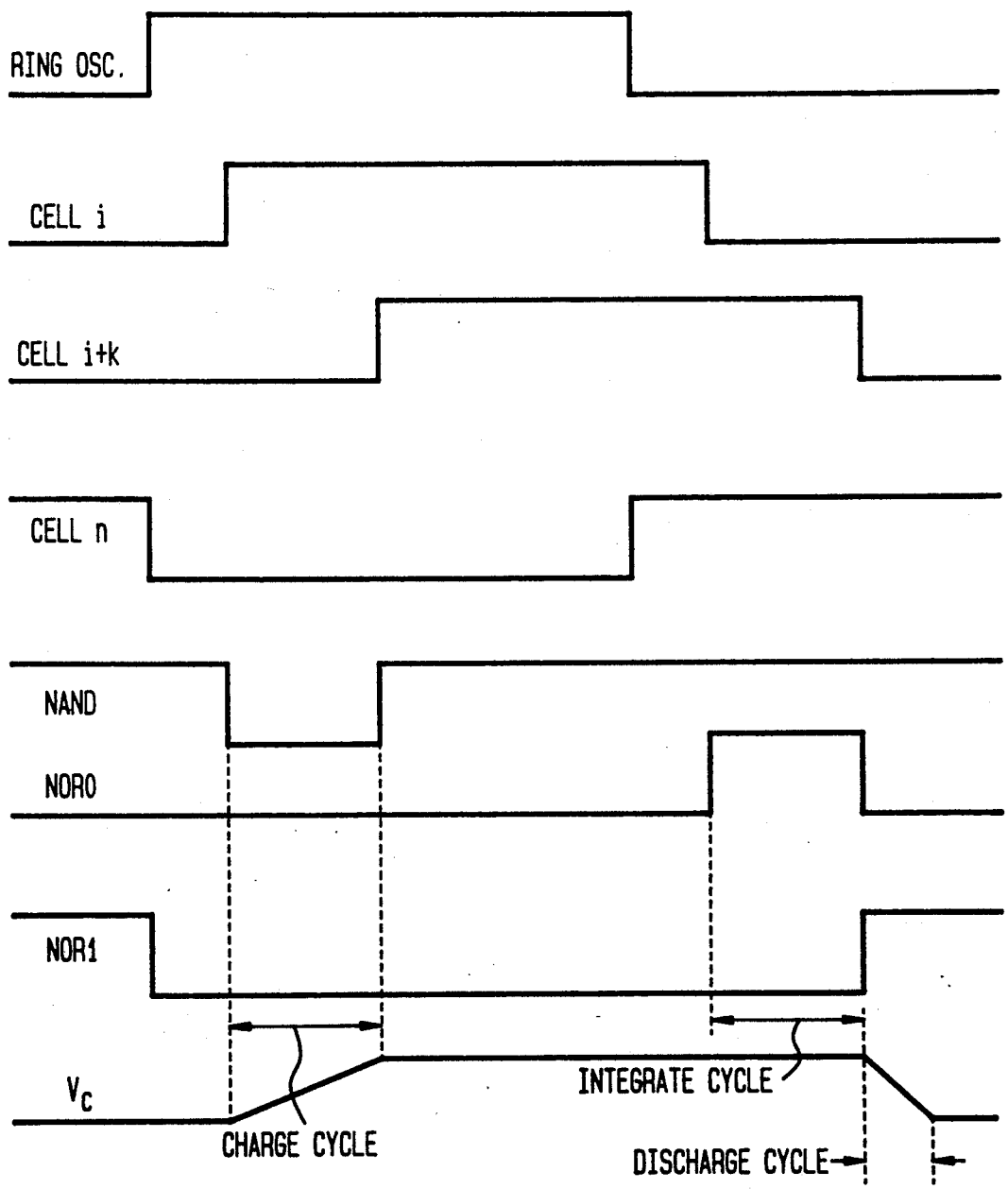

The $NOR_0$ output connects the capacitor C voltage to the $V_{error}$ filter for smoothing and updating compensation voltage. The output of $NOR_1$ connects the C capacitor to ground to be discharged and to be ready for the next cycle. Capacitor C voltage waveform is illustrated in FIG. 5 timing diagram.

OPERATIONAL DESCRIPTION

The architecture accommodates a Calibration mode and a Program mode. The Calibration mode allows to set the device delay with high accuracy at a particular temperature and power supply value.

The desired delay range and delay setting data is written into the volatile memory to set the magnitude of the delay circuit control signal. The device delay is measured and, if needed, the volatile memory data is updated to minimize the delay error. Once the error is brought within acceptable limits, the data from volatile memory can be transferred to the nonvolatile memory and the device mode is updated to Program mode. The Program mode allows device operation through temperature and power supply excursion.

The initial magnitude (delay setting) of the delay circuit control signal is generated by the data permanently stored in nonvolatile memory. Temperature and power supply induced errors, detected by the relative circuits, continuously update the delay circuit control signal magnitude to maintain delay deviations within specified tolerance.

Because many varying and different embodiments may be made within the scope of the inventive concept herein taught, and because many modifications may be made in the embodiments herein detailed in accordance with the descriptive requirement of the law, it is to be understood that the details herein are to be interpreted as illustrative and not in a limiting sense.

What is claimed is:

1. A programmable compensated digital delay circuit having a design format suited for integrated circuitry utilizing complementary MOS technology comprising:
   a first input for signals-to-be-delayed;
   a first plurality of time delay cells connected to said first input, said first plurality of time delay cells selectively interconnectable, for forming one or more delay configurations, each delay cell, in turn, comprising:
      a plurality of selectable capacitive elements arrayed therewithin in a weighted manner;
      a plurality of selectable current sources arrayed therewithin in a weighted manner;
   first memory means for selecting one or more of said plurality of capacitive elements, said memory means being programmable to function cooperatively with said, first plurality of time delay cells and interconnected therewith to switch differently rated capacitive elements into and out of said circuit;
   second memory means for selecting one or more of said plurality of current sources, said memory means being programmable to function cooperatively with said first plurality of time delay cells and interconnected therewith to switch differently rated current sources into and out of said circuit; and,
   first circuit means for generating a variable current from a reference voltage, said first circuit means connected to said first plurality of time delay cells;
   internal compensation means for compensating temperature and power supply variations, said compensation means connected to and functioning cooperatively with said first circuit means to adjust time delay of said first plurality of time delay cells;
   whereby a precision delay line is formed from complementary MOS technology without using a reference frequency for timing.

2. A programmable compensated digital delay circuit as described in claim 1 wherein said internal compensation means further comprises:
   ring oscillator means for temperature and power supply compensation, said oscillator means formed from a second plurality of time delay cells each selected for interchangeability with a corresponding one of said first plurality of time delay cells, said oscillator means having identically selected capacitive elements and current sources as the corresponding delay line, said output of said first plurality of time delay cells connected to an input of said ring oscillator means;
   second circuit means for generating a variable current from said reference voltage, said second circuit means connected to said ring oscillator means; and,
   error voltage circuit means for generating an error voltage signal connected to said first circuit means to adjust the variable current to said first plurality of time delay cells.

3. A programmable compensated digital delay circuit as described in claim 2 wherein said error voltage error circuit means includes a delay-to-voltage circuit means for converting a time delay of said ring oscillator means to a voltage error output.

4. A programmable compensated digital delay circuit as described in claim 3 wherein said delay-to-voltage circuit means further comprises a delay-to-pulse-width converter and a pulse-width-to-voltage converter.

5. A programmable compensated digital delay circuit as described in claim 2 wherein said capacitive elements are weighted in a binary series format with each successive capacitive element in the series having twice the capacitance of the preceeding one.

6. A programmable compensated digital delay circuit as described in claim 5 wherein said selectable of said capacitive elements enables the selection of a time delay subrange that encompasses deviations arising from process variations.

7. A programmable compensated digital delay circuit as described in claim 2 wherein said current sources are weighted in a binary series format with each successive current source in the series having twice the rating of the preceding one.

8. A programmable compensated digital delay circuit as described in claim 7 wherein said selectable current sources enables the selection of a precise time delay that, with the capacitive element selection, is in a subnanosecond range.

9. A programmable compensated digital delay circuit having a design format suited for integrated circuitry with components deposited on a substrate thereon by complementary MOS technology having matched pairs comprising:
   a first input for signals-to-be-delayed;
   a first plurality of time delay cells connected to said first input, said first plurality of time delay cells selectively interconnectable, for forming one or more delay lines, each time delay cell having a plurality of controllably selectable circuit components, including capacitive elements and current sources;
   a non-volatile memory for selecting one or more said components within said integrated circuit, said memory connected with and operative to switch said components into and out of the programmable compensated digital delay circuit;
   first circuit means for generating a variable current from a reference voltage, said first circuit means connected to said first plurality of time delay cells;
   ring oscillator means for temperature and power supply compensation, said ring oscillator means formed from a second plurality of time delay cells selected for interchangeability with said first plurality of time delay cells, said oscillator means having identically selected capacitive elements and current sources as the corresponding delay line, an output of said first plurality of time delay cells connected to an input of the ring oscillator means;
   second circuit means for generating a variable current from said reference voltage, said second circuit means connected to said ring oscillator means; and,
   error voltage circuit means for generating an error voltage signal connected to said first circuit means to adjust the variable current to said first plurality of time delay cells;
   whereby a precision delay line is formed from complementary MOS technology without using a reference frequency for timing.

10. A programmable compensated digital delay circuit as described in claim 9 wherein said first plurality of time delay cells further comprises:

a plurality of selectable capacitive elements arrayed therewithin in a weighted manner; and, a plurality of selectable current sources arrayed therewithin in a weighted manner.

11. A programmable compensated digital delay circuit as described in claim 10 wherein said non-volatile memory further comprises:

first memory means for selecting one or more of said plurality of capacitive elements, said memory means being programmable to function cooperatively with said first plurality of delay cells and interconnected therewith to switch differently rated capacitive elements into and out of said circuit;

second memory means for selecting one or more of said plurality of current sources, said memory means being programmable to function cooperatively with said first plurality of time delay cells and interconnected therewith to switch differently rated current sources into and out of said circuit.

12. A programmable compensated digital delay circuit as described in claim 9 wherein said error voltage circuit means further comprises a delay-to-pulse-width converter and a pulse-width-to-voltage converter.

13. A programmable compensated digital delay circuit as described in claim 12 wherein said capacitive elements are weighted in a binary series format with each successive capacitive element in the series having twice the capacitance of the preceeding one.

14. A programmable compensated digital delay circuit as described in claim 13 wherein said selectable capacitive elements enables the selection of a time delay subrange that encompasses deviations arising from process variations.

15. A programmable compensated digital delay circuit as described in claim 9 further includes:

a pulse-width distortion compensation means for compensating the delay for switching nonlinearities, said pulse-width compensation means serially connected to said first plurality of time delay cell, an even number of selectable delay elements so as to thereby cancel transfer function deviations, said even number of selectable delay elements are selected from said matched pairs of said components deposited on said substrate.

16. A programmable compensated digital delay circuit having a design format suited for integrated circuitry utilizing complementary MOS technology comprising:

a first input for signals-to-be-delayed;

a first plurality of time delay cells connected to said first input, said first plurality of time delay cells selectively interconnectable, for forming one or more delay configurations, each delay cell, in turn, comprising:

a plurality of selectable capacitive elements arrayed therewithin in a weighted manner;

a plurality of selectable current sources arrayed therewithin in a weighted manner;

first memory means for selecting one or more of said plurality of capacitive elements, said first memory means being programmable to function cooperatively with said first plurality of time delay cells and interconnected therewith to switch differently rated capacitive elements into and out of said circuit;

second memory means for selecting one or more of said plurality of current sources, said second memory means being programmable to function cooperatively with said first plurality of time delay cells and interconnected therewith to switch differently rated current sources into and out of said circuit; and, first circuit means for generating a variable current from a reference voltage, said first circuit means connected to said first plurality of time delay cells;

a pulse-width distortion compensation means for compensating the delay line for switching nonlinearities, said pulse-width compensation means serially connected to said first plurality of time delay cells, an even number of selectable delay elements so as to thereby cancel transfer function deviations, said even number of selectable delay elements are selected from said matched pairs of said components deposited on said substrate;

internal compensation means for compensating temperature and power supply variations, said compensation means connected to and functioning cooperatively with said first circuit means t adjust the time delay of the delay cells;

whereby a precision delay line is formed from complementary MOS technology without using a reference frequency for timing.

17. A programmable compensated digital delay circuit as described in claim 16 wherein said internal compensation means further comprises:

ring oscillator means for temperature and power supply compensation, said ring oscillator means formed from a second plurality of time delay cells selected for interchangeability with said first plurality of delay cells, said oscillator means having identically selected capacitive elements and current sources as the corresponding delay line an output of said first plurality of time delay cells connected to an input of said ring oscillator means;

second circuit means for generating a variable current from a reference voltage, said second circuit means connected to said ring oscillator; and, error voltage circuit means for generating an error voltage signal connected to said first circuit means to adjust the variable current to the time delay cells.

18. A programmable compensated digital delay circuit as described in claim 17 wherein said error voltage error circuit means includes a delay-to-voltage circuit means for converting the time delay of said ring oscillator means to a voltage error output.

19. A programmable compensated digital delay circuit as described in claim 16 wherein said capacitive elements are weighted in a binary series format with each successive capacitive element in the series having twice the capacitance of the preceeding one.

20. A programmable compensated digital delay circuits as described in claim 19 wherein said selectable capacitive elements enables the selection of a time delay subrange that encompasses deviations arising from process variations.

21. A programmable compensated digital delay circuit as described in claim 17 wherein said current sources are weighted in a binary series format with each successive current source in the series having twice the rating of the preceeding one.

22. A programmable compensated digital delay circuit as described in claim 21 wherein said selectable current sources enables the selection of a precise time delay that, with the capacitive element selection, is in a sub-nanosecond range.

* * * * *